United States Patent
Lee et al.

(10) Patent No.: US 9,230,804 B2
(45) Date of Patent: Jan. 5, 2016

(54) SEMICONDUCTOR DEVICES AND METHODS OF MANUFACTURING THE SAME

(75) Inventors: Sangmoon Lee, Yongin-si (KR); Euijoon Yoon, Seoul (KR); Jinsub Park, Suwon-si (KR); Sung Hyun Park, Seoul (KR)

(73) Assignees: SAMSUNG ELECTRONICS CO., LTD., Gyeonggi-Do (KR); SNU R&DB FOUNDATION, Seoul (KR)

( * ) Notice: Subject to any disclaimer, the term of this patent is extended or adjusted under 35 U.S.C. 154(b) by 231 days.

(21) Appl. No.: 13/242,827

(22) Filed: Sep. 23, 2011

(65) Prior Publication Data

US 2012/0205783 A1 Aug. 16, 2012

(30) Foreign Application Priority Data

Feb. 14, 2011 (KR) .......................... 10-2011-0012863

(51) Int. Cl.
*H01L 29/778* (2006.01)
*H01L 21/02* (2006.01)

(52) U.S. Cl.
CPC ........ *H01L 21/0254* (2013.01); *H01L 21/0242* (2013.01); *H01L 21/02378* (2013.01); *H01L 21/02381* (2013.01); *H01L 21/02392* (2013.01); *H01L 21/02395* (2013.01); *H01L 21/02398* (2013.01); *H01L 21/02488* (2013.01); *H01L 21/02628* (2013.01); *H01L 21/02647* (2013.01)

(58) Field of Classification Search
CPC ..................... H01L 21/0254; H01L 21/02378; H01L 21/02381; H01L 21/02392

USPC .......................... 257/14, E21.097, 98, 79, 103
See application file for complete search history.

(56) References Cited

U.S. PATENT DOCUMENTS

| | | | |
|---|---|---|---|
| 7,445,984 B2 | 11/2008 | Rao et al. | |
| 7,824,942 B2 | 11/2010 | Tu et al. | |
| 8,237,152 B2* | 8/2012 | Mastro et al. | 257/14 |
| 8,313,970 B2* | 11/2012 | Quevy et al. | 438/48 |
| 2002/0022290 A1 | 2/2002 | Kong et al. | |
| 2008/0026526 A1 | 1/2008 | Rao et al. | |
| 2008/0087881 A1 | 4/2008 | Ueda et al. | |
| 2009/0001398 A1 | 1/2009 | Song et al. | |

(Continued)

FOREIGN PATENT DOCUMENTS

| | | |
|---|---|---|
| CN | 1378702 A | 11/2002 |
| CN | 101874286 A | 10/2010 |

(Continued)

OTHER PUBLICATIONS

Extended European Search Report issued in European Application No. 12155353.1, dated Apr. 9, 2014.

(Continued)

*Primary Examiner* — Michael Shingleton
(74) *Attorney, Agent, or Firm* — Harness, Dickey & Pierce, P.L.C.

(57) ABSTRACT

A semiconductor device includes a first non-flat non-polar nitride semiconductor layer, a first structure layer on at least a portion of the surface of the first non-flat non-polar nitride semiconductor layer and a first non-polar nitride semiconductor layer on the first non-flat non-polar nitride semiconductor layer and the first structure layer. The first non-flat non-polar nitride semiconductor layer includes a plurality of solid particles.

16 Claims, 7 Drawing Sheets

(56) References Cited

U.S. PATENT DOCUMENTS

| | | |
|---|---|---|
| 2009/0267097 A1 | 10/2009 | Tu et al. |
| 2010/0295084 A1 | 11/2010 | Tu et al. |
| 2010/0320506 A1 | 12/2010 | Varangis et al. |
| 2014/0243863 A1 | 8/2014 | Faller et al. |

FOREIGN PATENT DOCUMENTS

| | | |
|---|---|---|
| JP | 2006-179879 A | 7/2006 |
| JP | 2007-059762 A | 3/2007 |
| JP | 2007-145639 A | 6/2007 |
| JP | 2007-266157 A | 10/2007 |
| JP | 2008-053372 A | 3/2008 |
| KR | 10-0944946 B1 | 4/2009 |
| KR | 2010-0029704 A | 3/2010 |

OTHER PUBLICATIONS

Xu, et al., "Facile preparation of monodisperse micrometer-sized hollow silica spheres with tunable size and commendable surface topography", Materials Research Bulletin 45 (2010) pp. 1056-1063. Available online Jun. 12, 2010.

Zhang, et al., "Hollow Silica Spheres: Synthesis and Mechanical Properties", Langmuir vol. 25, No. 5 (2009), pp. 2711-2717. Published on Web Jan. 27, 2009.

Masui, et al., "Recent progress in nonpolar LEDs as polarized light emitters", Phys. Status Solidi A 206, No. 2, (2009), pp. 203-205. Published online Nov. 27, 2008.

Kwang-Choong Kim, et al., "Improved electroluminescence on nonpolar $m$-plane InGaN/GaN quantum wells LEDs", phys. stat. sol. (RRL) 1, No. 3, pp. 125-127 (2007).

Hirai et al., "Defect-mediated surface morphology of nonpolar m-plane GaN", Applied Physics Letters 90, pp. 121119-121119-3 (2007).

Paskov, et al., "Emission properties of a -plane GaN grown by metal-organic chemical-vapor deposition", Journal of Applied Physics 98, 093519-093519-7 (2005).

Waltereit, et al., "Nitride semiconductors free of electrostatic fields for efficient white light-emitting diodes", Letters to Nature, vol. 406, Aug. 24, 2000, pp. 865-868.

Haskell, et al., "Defect reduction in (1120) a-plane gallium nitride via lateral epitaxial overgrowth by hydride vapor-phase epitaxy", Applied Physics Letters 83, 644 (2003), pp. 644-646.

Moram, et al., "Dislocation reduction in gallium nitride films using scandium nitride interlayers", Applied Physics Letters 91, pp. 152101-152101-3 (2007).

Li, et al., "Dislocation density reduction in GaN by dislocation filtering through a self-assembled monolayer of silica microspheres", Applied Physics Letters 94, pp. 231105-231105-3 (2009).

Tanya Paskova (Editor), "Nitrides with Nonpolar Surfaces: Growth, Properties, and Devices", WILEY-VCH, Mar. 2008, 464 pages.

Chinese Office Action issued in Chinese Patent Application No. 201210032437.4, issued Aug. 4, 2015.

* cited by examiner

SEMICONDUCTOR DEVICES AND METHODS OF MANUFACTURING THE SAME

CROSS-REFERENCE TO RELATED APPLICATION(S)

This application claims priority under 35 U.S.C. §119 to Korean Patent Application No. 10-2011-0012863, filed on Feb. 14, 2011, in the Korean Intellectual Property Office, the disclosure of which is incorporated herein in its entirety by reference.

BACKGROUND

1. Field

Example embodiments relate to semiconductor devices including a non-polar face, and/or methods of manufacturing the same.

2. Description of the Related Art

A semiconductor material grown in a heterojunction semiconductor thin film structure may be used to form optical or electrical devices by adjusting a lattice constant or a band gap of the semiconductor. A nitride semiconductor is an example of such a semiconductor material.

A nitride semiconductor is relatively stable both thermally and chemically, and also has a relatively wide direct transition band gap. Thus, a nitride semiconductor material is used to form electronic devices, such as heterojunction bipolar transistors (HBTs), high electron mobility transistors (HEMTs), metal semiconductor field effect transistors (MESFETs), etc. Nitride semiconductor materials are also used to form light-emitting devices, such as laser diodes (LDs) that generate light in a relatively short wavelength band, light-emitting diodes (LEDs), etc. In a more particular example, a nitride semiconductor material-based LED that generates blue or green light having a relatively short wavelength is a relatively high-output optical device that enables realization of various natural colors.

Conventionally, a nitride thin film (or layer) in a polar (0001) c-face direction is formed on a c-face sapphire substrate. However, due to an internal electric field, a quantum-confined stark effect (QCSE) occurs in the nitride thin film in the polar (0001) c-face direction. Thus, an internal quantum efficiency of the nitride thin film is relatively limited. In one alternative, a non-polar nitride optical element may be grown.

A non-polar GaN epitaxial layer using a hetero substrate, such as a sapphire substrate or a silicon-carbide (SiC) substrate, has a threading dislocation (TD) density of about $10^{10}$/ $cm^2$ and a relatively high basal stacking faults (BSF) density of about $10^5/cm^2$. The defect densities are several tens to several hundred times the defect density of an epitaxial layer when GaN is grown in a polar c-face direction. These defects function as non-emission portions and cause a reduction in quantum efficiency.

A thick sapphire substrate, epitaxial lateral overgrowth (ELO) and intermediate layer insertion have been explored in an effort to reduce these defects. However, processes associated with these alternatives are relatively complex, which increases costs and time.

SUMMARY

Example embodiments provide semiconductor devices, and methods of manufacturing the same.

Semiconductor devices, and methods of manufacturing the same, according to at least some example embodiments maintain a flat or substantially flat surface of a thin film formed of the hetero non-polar nitride semiconductor material when a hetero non-polar nitride semiconductor material having a lattice constant and/or thermal expansion coefficient different from that of a substrate is epitaxially grown.

Semiconductor devices, and methods of manufacturing the same, according to at least some example embodiments also have reduced defect density of the thin film and/or suppressed bending stresses of the substrate and the thin film.

Example embodiments also provide semiconductor devices having improved light extraction efficiency, and methods of manufacturing the same.

Additional aspects will be set forth in part in the description which follows and, in part, will be apparent from the description, or may be learned by practice of the example embodiments.

At least one example embodiment provides a semiconductor device including: a first non-flat non-polar nitride semiconductor layer; a first structure layer on at least a portion of a surface of the first non-flat non-polar nitride semiconductor layer, the first structure layer including a first plurality of solid particles; and a first non-polar nitride semiconductor layer on the first non-flat non-polar nitride semiconductor layer and the first structure layer.

According to at least some example embodiments, the first non-flat non-polar nitride semiconductor layer may have a three dimensional surface structure, and may be formed of a non-polar semiconductor. The surface of the first non-flat non-polar nitride semiconductor layer may include a first plurality of concave portions, and the first plurality of solid particles may be disposed in the first plurality of concave portions.

The semiconductor device may further include: a second non-flat non-polar nitride semiconductor layer on the first non-polar nitride semiconductor layer; a second structure layer on at least a portion of a surface of the second non-flat non-polar nitride semiconductor layer, the second structure layer including a second plurality of solid particles; and a second non-polar nitride semiconductor layer on the second non-flat non-polar nitride semiconductor layer and the second structure layer.

The second non-flat non-polar nitride semiconductor layer may have a three dimensional surface structure and be formed of a non-polar compound semiconductor. The surface of the second non-flat non-polar nitride semiconductor layer may include a second plurality of concave portions, and the second plurality of solid particles may be disposed in the second plurality of concave portions. The first plurality of concave portions and the second plurality of concave portions may be offset relative to one another.

According to at least some example embodiments, the first plurality of solid particles and the second plurality of solid particles may have at least one of different sizes and different shapes. For example, each of the first plurality of solid particles may have one of a spherical, spherical shell, polygonal and polygonal shell shape. A refractive index of each of the first plurality of solid particles may be different from a refractive index of the first non-polar nitride semiconductor layer.

Thicknesses of shells of the first plurality of solid particles may be between about 3% and about 50%, inclusive, of a radius of the solid particles. Gas may be trapped in shells of the first plurality of solid particles.

At least one other example embodiment provides a semiconductor device including: a first non-flat non-polar nitride semiconductor layer; a first structure layer on at least a portion of a surface of the first non-flat non-polar nitride semiconductor layer, the first structure layer including a plurality of solid particles; and a first non-polar nitride semiconductor layer on the first non-flat non-polar nitride semiconductor layer and the first structure layer. The first non-flat non-polar nitride semiconductor layer may have a three dimensional (3D) surface structure and may be formed of a non-polar nitride semiconductor.

At least one other example embodiment provides a semiconductor device. The semiconductor device includes: a first non-flat non-polar nitride semiconductor layer having a three-dimensional (3D) surface structure and being formed of a non-polar nitride semiconductor; a first structure layer formed on at least a portion of a surface of the first non-flat non-polar nitride semiconductor layer, and including a plurality of solid particles; and a first non-polar nitride semiconductor layer formed on the first non-flat non-polar nitride semiconductor layer and the first structure layer.

According to at least some example embodiments, the surface of the first non-flat non-polar nitride semiconductor layer may include a plurality of concave portions, and the plurality of solid particles of the first structure layer may be disposed in the plurality of concave portions.

The semiconductor device may further include: a second non-flat non-polar nitride semiconductor layer on the first non-polar nitride semiconductor layer; a second structure layer on at least a portion of a surface of the second non-flat non-polar nitride semiconductor layer, and including a plurality of solid particles; and a second non-polar nitride semiconductor layer on the second non-flat non-polar nitride semiconductor layer and the second structure layer. The second non-flat non-polar nitride semiconductor layer may have a 3D surface structure, and may be formed of a non-polar compound semiconductor.

The surface of the second non-flat non-polar nitride semiconductor layer may include a plurality of concave portions, and the plurality of solid particles of the second structure layer may be disposed in the plurality of concave portions.

The plurality of concave portions formed on the surface of the first non-flat non-polar nitride semiconductor layer and the plurality of concave portions formed on the surface of the second non-flat non-polar nitride semiconductor layer may be horizontally offset relative to one another.

The plurality of solid particles of the first structure layer and the plurality of solid particles of the second structure layer may have different sizes and/or shapes.

Each of the solid particles may include at least one of silica ($SiO_2$), alumina ($Al_2O_3$), titania ($TiO_2$), zirconia ($ZrO_2$), yttria stabilized zirconia ($Y_2O_3$—$ZrO_2$), copper oxide (CuO, $Cu_2O$), tantalum oxide ($Ta_2O_5$), combinations thereof, and the like.

Each of the solid particles of the first structure layer may have a spherical or polygonal shape. A refractive index of each of the plurality of solid particles may be different from a refractive index of the first non-polar nitride semiconductor layer.

Each of the solid particles of the first structure layer may have a spherical shell or polygonal shell shape. A thickness of the shell may be between about 3% and about 50%, inclusive, of a radius of the solid particle.

Gas may be trapped in the shell, and a refractive index of each of the solid particles may be the same as or different from a refractive index of the first non-polar nitride semiconductor layer.

According to at least some example embodiments, a substrate may be disposed on a lower portion of the first non-flat non-polar nitride semiconductor layer. In one example, the substrate may be formed of a material including one of alumina ($Al_2O_3$), silicon (Si), silicon-carbide (SiC), silicon-germanium (SiGe), germanium (Ge), gallium arsenide (GaAs), indium phosphide (InP), gallium nitride (GaN), indium-arsenide (InAs), gallium phosphide (GaP), gallium antimonide (GaSb), combinations thereof, and the like.

A buffer layer may be formed between the substrate and the first non-flat non-polar nitride semiconductor layer.

At least one other example embodiment provides a method of manufacturing a semiconductor device. According to at least this example embodiment, the method includes: forming a first non-flat non-polar nitride semiconductor layer; forming a first structure layer on at least a portion of a surface of the first non-flat non-polar nitride semiconductor layer, the first structure layer including a plurality of solid particles; and forming a first non-polar nitride semiconductor layer on the first non-flat non-polar nitride semiconductor layer and the first structure layer. The first non-flat non-polar nitride semiconductor layer may have a 3D surface structure and may be formed of a non-polar nitride semiconductor material.

At least one other example embodiment provides a method of manufacturing a semiconductor device. According to at least this example embodiment, the method includes: forming a first non-flat non-polar nitride semiconductor layer having a three-dimensional (3D) surface structure on a substrate, the first non-flat non-polar nitride semiconductor layer including a non-polar nitride semiconductor; forming a first structure layer on at least a portion of a surface of the first non-flat non-polar nitride semiconductor layer using a plurality of solid particles; and forming a first non-polar nitride semiconductor layer on the first non-flat non-polar nitride semiconductor layer and the first structure layer.

According to at least some example embodiments, the forming of the first non-flat non-polar nitride semiconductor layer may include forming a plurality of concave portions on the surface of the first non-flat non-polar nitride semiconductor layer. The forming of the first structure layer may include disposing the plurality of solid particles of the first structure layer only in the plurality of concave portions. The forming of the first non-polar nitride semiconductor layer may include inducing epitaxial lateral overgrowth (ELO) from the first non-flat non-polar nitride semiconductor layer using the first structure layer as a mask. A buffer layer may be formed between the substrate and the first non-flat non-polar nitride semiconductor layer.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
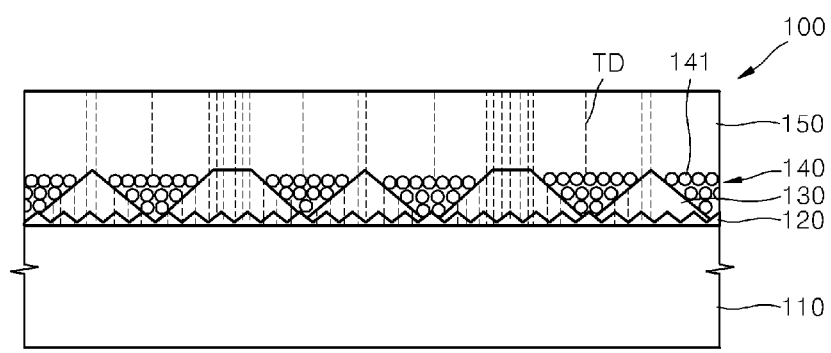
FIG. 1 is a cross-sectional view schematically illustrating a semiconductor device according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
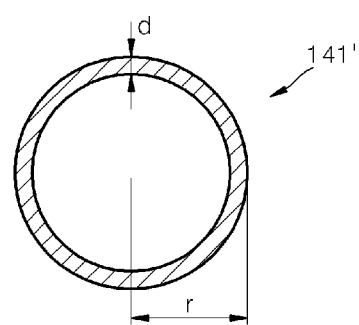
FIG. 2 illustrates a solid particle according to an example embodiment usable in the semiconductor device illustrated in FIG. 1.

FIG. 1 is a cross-sectional view schematically illustrating a semiconductor device 100 according to an example embodiment. FIG. 2 illustrates a solid particle 141' according to an example embodiment usable in the semiconductor device 100 illustrated in FIG. 1.

Referring to FIG. 1, the semiconductor device 100 has a three-dimensional (3D) surface structure. As shown, the semiconductor device 100 includes: a first non-flat non-polar nitride semiconductor layer 130 formed of a non-polar nitride semiconductor; a first structure layer 140 formed on at least a portion of a surface of the first non-flat non-polar nitride semiconductor layer 130; and a first non-polar nitride semiconductor layer 150 formed on the first non-flat non-polar nitride semiconductor layer 130 and the first structure layer 140. The first structure layer 140 includes a plurality of solid particles 141. As discussed herein, the particles are referred to as "solid particles." According to at least some example embodiments, the solid particles may be solid or shell-shaped. In one example, the shell-shaped particles may be gas-filled.

According to the example embodiment shown in FIG. 1, the non-polar nitride may reduce polarization caused by an internal electric field while improving (e.g., maximizing) quantum efficiency. Generally, when a nitride is formed in a polar (0001) c-face direction, a quantum-confined start effect (QCSE) occurs in the nitride due to the internal electric field. Thus, the internal quantum efficiency is limited. To reduce the internal quantum efficiency limitation, for example, when a direction of a gallium nitride (GaN) epitaxial layer is at a non-polar face (e.g., when non-polar GaN is epitaxially grown at a {1-100} m-face or {11-20} a-face), GaN may be grown parallel to a c-axis (0001) surface. As a result, the GaN epitaxial layer has no polarity. Accordingly, the decrease in internal quantum efficiency due to polarization may be suppressed.

A non-polar GaN epitaxial layer formed on a hetero substrate has a relatively high threading dislocation (TD) density and/or basal stacking faults (BSF) density. In this example embodiment, the first structure layer 140 formed of the plurality of solid particles 141 forms a relatively high-quality non-polar nitride by reducing the TD density and/or the BSF density.

A more detailed discussion of the configuration and the material of the semiconductor device 100 is provided below.

Still referring to FIG. 1, the substrate 110 may be any substrate used in epitaxial growth of a hetero thin film of a semiconductor material, such as alumina ($Al_2O_3$), silicon (Si), silicon-carbide (SiC), silicon-germanium (SiGe), germanium (Ge), gallium arsenide (GaAs), indium phosphide (InP), gallium nitride (GaN), indium-arsenide (InAs), gallium phosphide (GaP), or gallium antimonide (GaSb) substrate. In this example, the hetero thin film may include all or substantially all compound semiconductor materials such as GaN, aluminum nitride (AlN), indium nitride (InN), indium-aluminum-arsenic (InAlAs), indium-aluminum-gallium-arsenic (InAlGaAs), InP, indium-gallium-arsenic-phosphorous (InGaAsP), indium-gallium-arsenic (InGaAs), GaAs, and the like.

The first non-flat non-polar nitride semiconductor layer 130 is formed on the substrate 110. The first non-flat non-polar nitride semiconductor layer 130 has a 3D surface structure, and is formed of a non-polar nitride semiconductor. The first non-flat non-polar nitride semiconductor layer 130 may be epitaxially grown at a non-polar face. The surface of the first non-flat non-polar nitride semiconductor layer 130 is not flat, but 3D.

As illustrated in FIG. 1, the surface of the first non-flat non-polar nitride semiconductor layer 130 includes a plurality of concave portions. However, the particular structure of the surface of the first non-flat non-polar nitride semiconductor layer 130 is only illustrative, and the structure and/or arrangement of the concave portions may be random. The thickness of the first non-flat non-polar nitride semiconductor layer 130 may be between about 100 nm and about 1 mm, inclusive.

A buffer layer 120 is formed between the substrate 110 and the first non-flat non-polar nitride semiconductor layer 130. The buffer layer 120 is formed to suppress and/or prevent misalignment caused by lattice constant mismatch between the substrate 110 and the first non-flat non-polar nitride semiconductor layer 130, and/or to suppress and/or prevent cracks from occurring due to differences in thermal expansion coefficients. The buffer layer 120 may be formed of a non-polar nitride semiconductor material. The buffer layer 120 may have a single layer structure or a multi-layer structure. The thickness of the buffer layer 120 may be within a range in which lattice relaxation occurs. For example, when the buffer layer 120 is formed of GaN, the buffer layer 120 may have a thickness between about 10 nm and about 100 nm, inclusive.

Still referring to FIG. 1, the first structure layer 140 includes the plurality of solid particles 141 and is formed on at least a portion of the surface of the first non-flat non-polar nitride semiconductor layer 130. The first structure layer 140 may be formed such that the plurality of solid particles 141 are disposed in the plurality of concave portions of the first non-flat non-polar nitride semiconductor layer 130. In the example embodiment shown in FIG. 1, the plurality of solid particles 141 are disposed only in the plurality of concave portions of the first non-flat non-polar nitride semiconductor layer 130.

The first structure layer 140 may improve the quality of the first non-flat non-polar nitride semiconductor layer 150 formed on the first structure layer 140. For example, the first structure layer 140 may suppress and/or prevent nitride growth in a lower portion of the first structure layer 140, and a non-polar nitride may be re-grown from the first non-flat non-polar nitride semiconductor layer 130 exposed at the surface of the first structure layer 140 to obtain an epitaxial lateral overgrowth (ELO) effect caused by the first structure layer 140. In this example, the first structure layer 140 acts as an ELO mask and suppresses and/or prevents formation of threading dislocation (TD), thereby forming a relatively high-quality non-polar nitride thin film with a relatively low defect density.

The first structure layer 140 may also adjust a refractive index of the non-polar nitride thin film. In more detail, for example, the first structure layer 140 allows generated photons to more efficiently leak from the non-polar nitride thin film by making a relatively large difference in refractive indices between the non-polar nitride thin film and the substrate 110. In addition, when the thermal expansion coefficient of the substrate 110 is larger than that of the first non-flat non-polar nitride semiconductor layer 130 and/or the first non-polar nitride semiconductor layer 150, the overall stress of the non-polar nitride thin film may be reduced as the space between the solid particles 141 of the first structure layer 140 in which a nitride is not grown and the space between the solid particles 141 and the nitride are compressed during a temperature drop. Thus, the first structure layer 140 may suppress and/or prevent bending of the substrate 110.

The solid particles 141 of the first structure layer 140 may include at least one of silica ($SiO_2$), alumina ($Al_2O_3$), titania ($TiO_2$), zirconia ($ZrO_2$), yttria stabilized zirconia ($Y_2O_3$—$ZrO_2$), copper oxide ($CuO$, $Cu_2O$), tantalum oxide ($Ta_2O_5$), a combination thereof, or the like. The solid particles 141 may have a polygonal shape as well as a spherical shape as illustrated in FIG. 1, and may be formed of a material having a different refractive index from the first non-flat non-polar nitride semiconductor layer 130.

The solid particles may also have a spherical shell shape as illustrated in FIG. 2.

Referring to FIG. 2, the thickness d of the shell of the solid particles 141' may be between about 3% and about 50%, inclusive, of a radius r of the solid particle 141'. In this example, the refractive index of the solid particles 141' may be the same as, similar to or different from the refractive index of the first non-flat non-polar nitride semiconductor layer 130. This is because gas is trapped in the shell and even when there is no difference in refractive indices between the solid particles 141' and the first non-flat non-polar nitride semiconductor layer 130, a difference in refractive indices within the first structure layer 140 may result from the gas trapped in the solid particles 141'. The solid particles 141' may have a polygonal shell shape as well as the spherical shell shape illustrated in FIG. 2.

The diameter of the solid particles 141 or 141' may be between about 10 nm and about 100 nm, inclusive. The particular size of the solid particles 141 or 141' and/or density at which the solid particles 141 or 141' are distributed in the concave portions may be determined based on the quality of a layer (e.g., thin layer or thin film) of the first non-polar nitride semiconductor layer 150 to be formed on the first structure layer 140.

Referring back to FIG. 1, the first non-polar nitride semiconductor layer 150 is formed on the first non-flat non-polar nitride semiconductor layer 130 and the first structure layer 140. The first non-flat non-polar nitride semiconductor layer 130 has a structure in which a nitride semiconductor is epitaxially grown at a non-polar face. As described above, the first structure layer 140 may suppress and/or prevent a non-polar nitride from growing in a lower portion of the first structure layer 140 and causes ELO from the first non-flat non-polar nitride semiconductor layer 130 exposed to a peripheral portion of the surface of the first structure layer 140. Thus, the first non-polar nitride semiconductor layer 150 has a relatively good surface state, unlike the first non-flat non-polar nitride semiconductor layer 130. Also, TD may be suppressed by the first structure layer 140, and thus, the TD density may also be reduced.

The first non-polar nitride semiconductor layer 150 may have a structure that is not doped with impurities (an impurity-undoped structure). Alternatively, the first non-polar nitride semiconductor layer 150 may be doped with n-type or p-type impurities.

Figure 3:
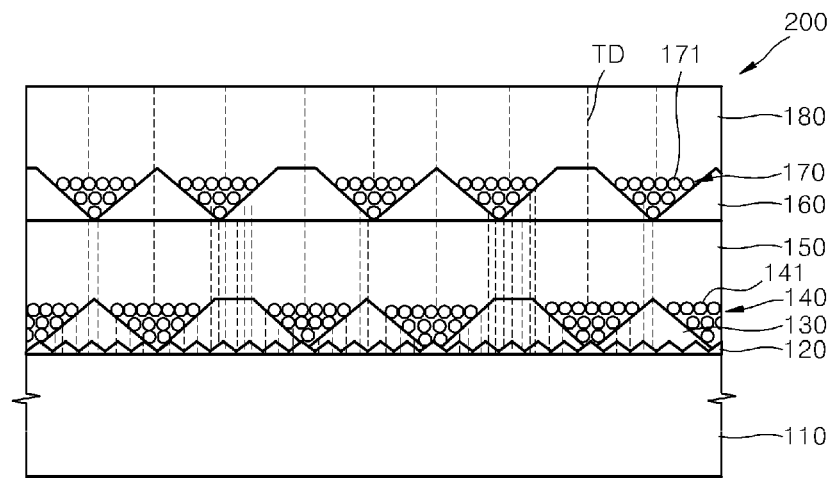
FIG. 3 is a cross-sectional view schematically illustrating a semiconductor device according to another example embodiment.

FIG. 3 is a cross-sectional view schematically illustrating a semiconductor device 200 according to another example embodiment.

Referring to FIG. 3, the semiconductor device 200 includes a second non-flat non-polar nitride semiconductor layer 160, a second structure layer 170 and a second non-polar nitride semiconductor layer 180 formed on the semiconductor device shown in FIG. 1. In more detail, the second non-flat non-polar nitride semiconductor layer 160 is formed on the first non-polar nitride semiconductor layer 150. The second non-flat non-polar nitride semiconductor layer 160 has a 3D surface structure and is formed of a non-polar compound semiconductor. The second structure layer 170 is formed on at least a portion of a surface of the second non-flat non-polar nitride semiconductor layer 160, and includes a plurality of solid particles 171. The second non-polar nitride semiconductor layer 180 is formed on the second non-flat non-polar nitride semiconductor layer 160 and the second structure layer 170.

The semiconductor device 200 shown in FIG. 3 includes multiple structure layers, which may further reduce TD. For example, the first structure layer 140 may suppress TD such that the TD does not propagate to the surface of the first non-polar nitride semiconductor layer 150. Also, TD formed in the vicinity of the first structure layer 140 and propagated to the surface of the first non-polar nitride semiconductor layer 150 is suppressed by the second structure layer 170, and does not propagate to a surface of the second non-polar nitride semiconductor layer 180. Thus, the TD density may be further reduced as compared to the case of FIG. 1.

Still referring to FIG. 3, the surface of the second non-flat non-polar nitride semiconductor layer 160 includes a plurality of concave portions similar or substantially similar to the first non-flat non-polar nitride semiconductor layer 130. The plurality of solid particles 171 of the second structure layer 170 may be disposed in the plurality of concave portions. As illustrated in FIG. 3, the plurality of solid particles 171 of the second structure layer 170 may be disposed only in the plurality of concave portions.

The plurality of concave portions formed at the surface of the first non-flat non-polar nitride semiconductor layer 130 and the plurality of concave portions formed at the surface of the second non-flat non-polar nitride semiconductor layer 160 may be misaligned or offset (e.g., horizontally offset) with respect to one another. In the drawings, all of the plurality of concave portions formed on the surface of the first non-flat non-polar nitride semiconductor layer 130 and the all of the plurality of concave portions formed on the surface of the second non-flat non-polar nitride semiconductor layer 160 are offset with respect to one another. However, this is illustrative only. In alternative example embodiments, the plurality of concave portions formed on the surface of the first non-flat non-polar nitride semiconductor layer 130 and/or the plurality of concave portions formed on the surface of the second non-flat non-polar nitride semiconductor layer 160 may have random sizes and/or distribution. Thus, a portion of the plurality of concave portions formed on the surface of the first non-flat non-polar nitride semiconductor layer 130 and a portion of the plurality of concave portions formed on the surface of the second non-flat non-polar nitride semiconductor layer 160 may be offset with respect to one another, and the other portion thereof may be opposite or vertically aligned with one another.

The plurality of solid particles 141 of the first structure layer 140 and the plurality of solid particles 171 of the second structure layer 170 may have different sizes and/or shapes. Moreover, the plurality of solid particles 141 and 171 may be shell shaped as illustrated in FIG. 2.

The second non-polar nitride semiconductor layer 180 may have a structure that is not doped with impurities (e.g., an impurity-undoped structure). Alternatively, the second non-polar nitride semiconductor layer 180 may be doped with n-type or p-type impurities.

Figure 4:
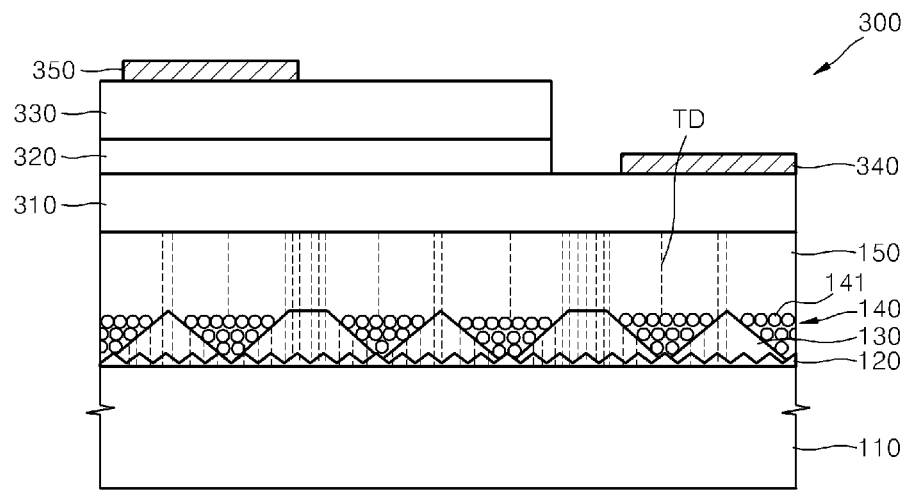
FIG. 4 is a cross-sectional view schematically illustrating a semiconductor device according to yet another example embodiment.

FIG. 4 is a cross-sectional view schematically illustrating a semiconductor device 300 according to another example embodiment.

As shown in FIG. 4, the semiconductor device 300 includes a light-emitting structure layer formed on the semiconductor device 100 shown in FIG. 1. The light-emitting structure acts as a light-emitting device.

In this example embodiment, a first type semiconductor layer 310, an active layer 320, and a second type semiconductor layer 330 are formed on the semiconductor device 100 of FIG. 1. A first electrode 340 and a second electrode 350 are formed on the first type semiconductor layer 310 and the second type semiconductor layer 330 to apply voltages to the first type semiconductor layer 310 and the second type semiconductor layer 330, respectively.

The first type semiconductor layer 310 may be formed of a nitride semiconductor doped with n-type impurities, such as, n-GaN. The n-type impurities may be one of Si, Ge, selenium (Se), tellurium (Te), and carbon (C).

The active layer 320 emits light due to electron-hole recombination. The active layer 320 maybe formed of an InGaN-based nitride semiconductor layer. An emission wavelength band of the active layer 320 is controlled by controlling band gap energy. For example, the active layer 320 may have an InGaN-based quantum well structure, such as a single quantum well structure, in which a quantum well layer and a barrier layer are formed of InGaN/GaN, InGaN/InGaN, InGaN/AlGaN or a pair of InGaN/InAlGaN. In an alternative example, the active layer 320 may have a multi-quantum well structure. The active layer 320 may adjust emission color by controlling an indium (In)-mole fraction of the InGaN layer.

The second type semiconductor layer 330 may be formed of a nitride semiconductor doped with p-type impurities, such as, p-GaN. The p-type impurities may be one of magnesium (Mg), beryllium (Be), zinc (Zn), and scandium (Sc).

When the first non-polar nitride semiconductor layer 150 is doped with n-type impurities, the first type semiconductor layer 310 may be omitted.

Figure 5:
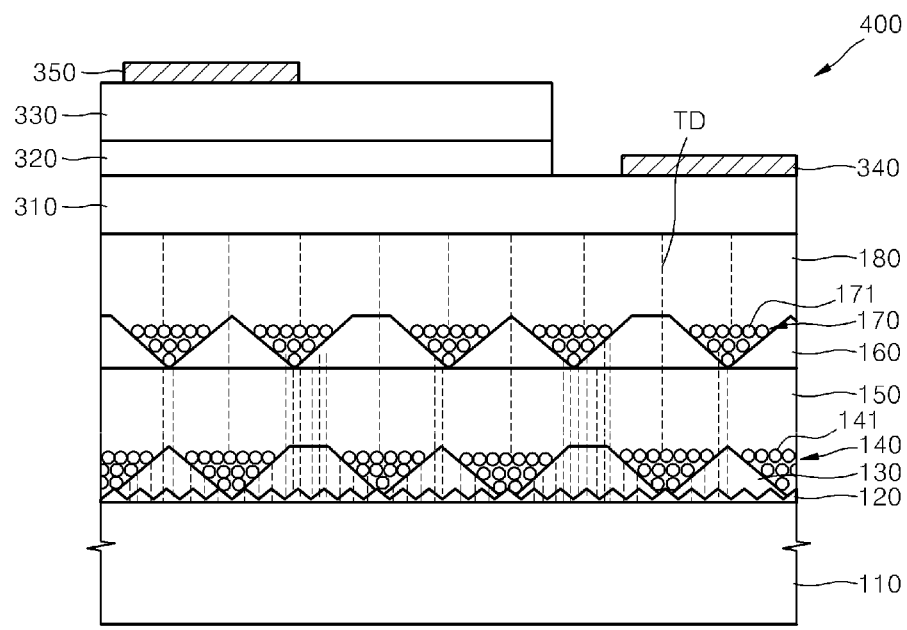
FIG. 5 is a cross-sectional view schematically illustrating a semiconductor device according to still another example embodiment.

FIG. 5 is a cross-sectional view schematically illustrating a semiconductor device 400 according to another example embodiment.

As shown in FIG. 5, the semiconductor device 400 includes a light-emitting structure layer formed on the semiconductor device 200 shown in FIG. 3. The light emitting structure acts as a light-emitting device. As with the light emitting structure shown in FIG. 4, the light emitting structure of FIG. 5 includes a first type semiconductor layer 310, an active layer 320, and a second type semiconductor layer 330 formed on the semiconductor device 200 of FIG. 3. A first electrode 340 and a second electrode 350 are formed on the first type semiconductor layer 310 and the second type semiconductor layer 330 to apply voltages to the first type semiconductor layer 310 and the second type semiconductor layer 330, respectively.

As in the example embodiment shown in FIG. 4, when the second non-polar nitride semiconductor layer 180 is doped with n-type impurities, the first type semiconductor layer 310 may be omitted.

The semiconductor device 300 illustrated in FIG. 4 and the semiconductor device 400 illustrated in FIG. 5 show relatively basic PN junction light-emitting structures, but may be modified in various ways. For example, the structure of the first electrode 340 and the second electrode 350 may have different shapes. In addition, the substrate 110 may be removed if necessary depending on the desired electrode structure, emission direction, etc.

FIGS. 6A through 6H are cross-sectional views illustrating methods of manufacturing semiconductor devices according to example embodiments. The method described with regard to FIGS. 6A through 6E may be used to form the semiconductor device 100 shown in FIG. 1. The method described with regard to FIGS. 6A through 6H may be used to form the semiconductor device 200 shown in FIG. 3. In FIGS. 1, 3, and 6A through 6H, like reference numerals refer to like elements.

Figure 6A:
FIGS. 6A through 6H are cross-sectional views illustrating methods of manufacturing semiconductor devices according to example embodiments.

Referring to FIG. 6A, the substrate 110 is prepared. The substrate 110 may be any substrate used in epitaxial growth of a hetero thin film of a semiconductor material, such as $Al_2O_3$, Si, SiC, SiGe, Ge, GaAs, InP, GaN, InAs, GaP or GaSb substrate.

Figure 6B:
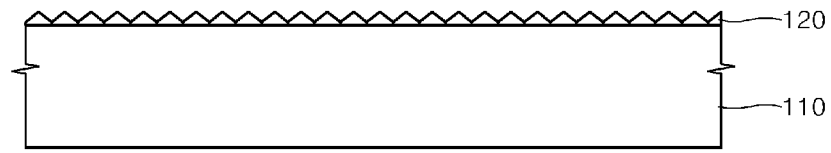

Referring to FIG. 6B, the buffer layer 120 is formed on the substrate 110. The buffer layer 120 may suppress and/or prevent misalignment caused by lattice constant mismatch between the substrate 110 and a non-polar nitride semiconductor layer to be formed on the buffer layer 120, and/or to suppress and/or prevent cracks from occurring due to differences in thermal expansion coefficients. The buffer layer 120 may be formed of a non-polar nitride semiconductor material. The buffer layer 120 may have a single layer structure or a multi-layer structure. The thickness of the buffer layer 120 may be within a range in which lattice relaxation occurs. For example, when the buffer layer 120 is formed of GaN, the buffer layer 120 may have a thickness between about 10 nm and about 100 nm, inclusive. The form of the surface of the buffer layer 120 is used to show that the surface of the buffer layer 120 is not flat, but is not limited to the shape illustrated in FIG. 6B.

Figure 6C:
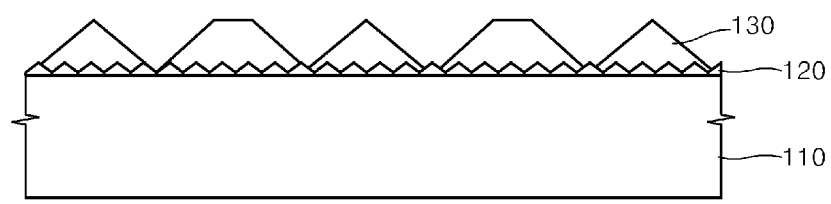

Referring to FIG. 6C, the first non-flat non-polar nitride semiconductor layer 130 is formed. The structure of the surface of the first non-flat non-polar nitride semiconductor layer 130 is an example non-flat surface formed by non-polar face growth. However, example embodiments are not limited to the shape shown in FIG. 6C. A plurality of concave portions are formed at the surface of the first non-flat non-polar nitride semiconductor layer 130. A particular structure of the plurality of concave portions and gaps therebetween may be adjusted using one or more growth variables.

Figure 6D:
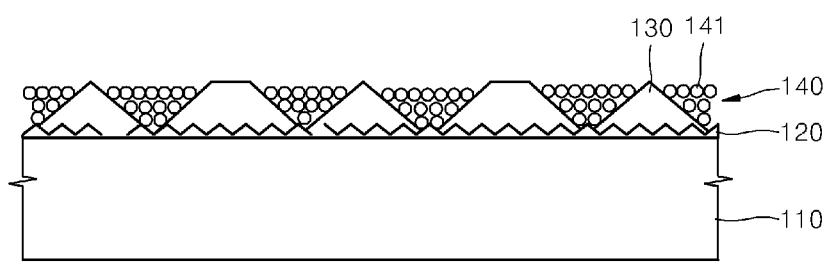

Referring to FIG. 6D, the first structure layer 140 including the solid particles 141 is formed on at least a portion of the surface of the first non-flat non-polar nitride semiconductor layer 130. The first structure layer 140 includes the plurality of solid particles 141 formed of at least one of silica ($SiO_2$), alumina ($Al_2O_3$), titania ($TiO_2$), zirconia ($ZrO_2$), yttria stabilized zirconia ($Y_2O_3$—$ZrO_2$), copper oxide (CuO, $Cu_2O$), tantalum oxide ($Ta_2O_5$), a combination thereof or the like. The first structure layer 140 may have a single layer structure or a multi-layer structure. The plurality of solid particles 141 are disposed in the concave portions formed on the surface of the first non-flat non-polar nitride semiconductor layer 130. In the example embodiment shown in FIG. 6D, the plurality of solid particles 141 are disposed only in the plurality of concave portions. However, example embodiments are not limited to this example embodiment.

The first structure layer 140 may be formed by coating a solution in which the plurality of solid particles 141 are dispersed onto the first non-flat non-polar nitride semiconductor layer 130, and removing a solvent portion of the dispersion solution, but leaving the solid particles 141. In this example, a density at which the plurality of solid particles 141 are coated on the concave portions may be adjusted by adjusting at least one of intensities of charges of the first non-flat non-polar nitride semiconductor layer 130 and the first structure layer 140, and the concentration of the dispersion solution.

Figure 6E:
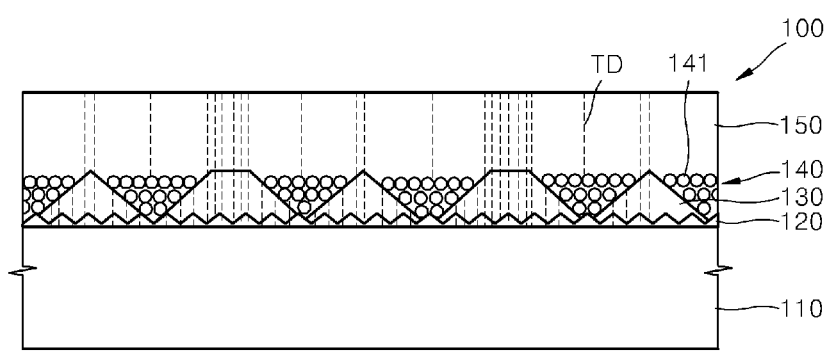

Referring to FIG. 6E, the first non-polar nitride semiconductor layer 150 is formed on the first non-flat non-polar nitride semiconductor layer 130 and the first structure layer 140. In this example, growth of a non-polar nitride may be suppressed and/or prevented in a lower portion of the first structure layer 140 and the first structure layer 140 may cause ELO from the first non-flat non-polar nitride semiconductor layer 130 exposed at a peripheral portion of the surface of the first structure layer 140. As a result, the first non-polar nitride semiconductor layer 150 has a relatively good surface state. Moreover, propagation of TD may be suppressed by the first structure layer 140, and thus, a TD density may also be reduced.

Through the process described with regard to FIGS. 6A through 6E, the semiconductor device 100 may be manufactured to have the structure illustrated in FIG. 1. Whether to dope the first non-polar nitride semiconductor layer 150 with impurities may be determined when forming the first non-polar nitride semiconductor layer 150, according to the function of a structure layer to be formed later. If necessary, the first non-polar nitride semiconductor layer 150 may be doped with n-type or p-type impurities.

Figure 6F:
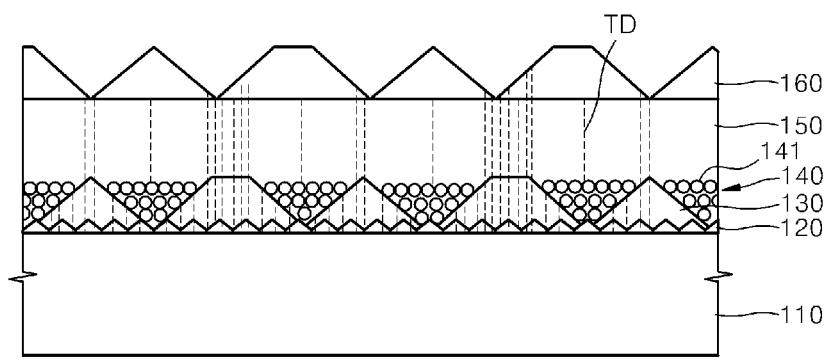

Referring to FIG. 6F, the second non-flat non-polar nitride semiconductor layer 160 is formed on the first non-polar nitride semiconductor layer 150. A plurality of concave portions are formed at the surface of the second non-flat non-polar nitride semiconductor layer 160, as in the first non-flat non-polar nitride semiconductor layer 130. The plurality of concave portions formed at the surface of the first non-flat non-polar nitride semiconductor layer 130 and the plurality of concave portions formed at the surface of the second non-flat non-polar nitride semiconductor layer 160 are misaligned or offset (e.g., horizontally offset) with respect to one another.

Figure 6G:
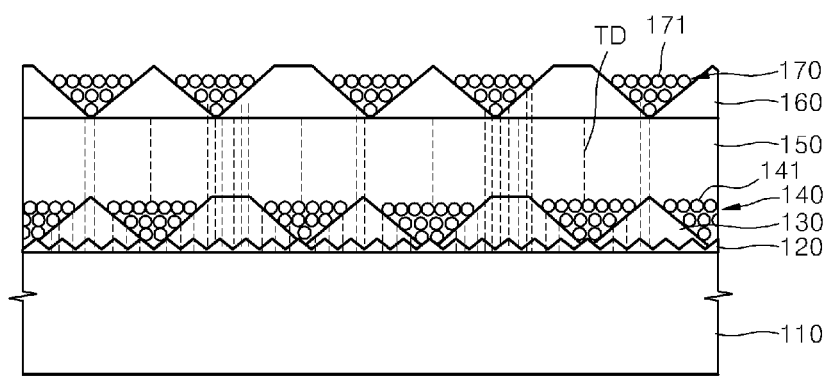

Referring to FIG. 6G, the second structure layer 170 including the plurality of solid particles 171 is formed on at least a portion of the surface of the second non-flat non-polar nitride semiconductor layer 160. In this example embodiment, the plurality of solid particles 171 of the second structure layer 170 are disposed in the plurality of concave portions.

Figure 6H:
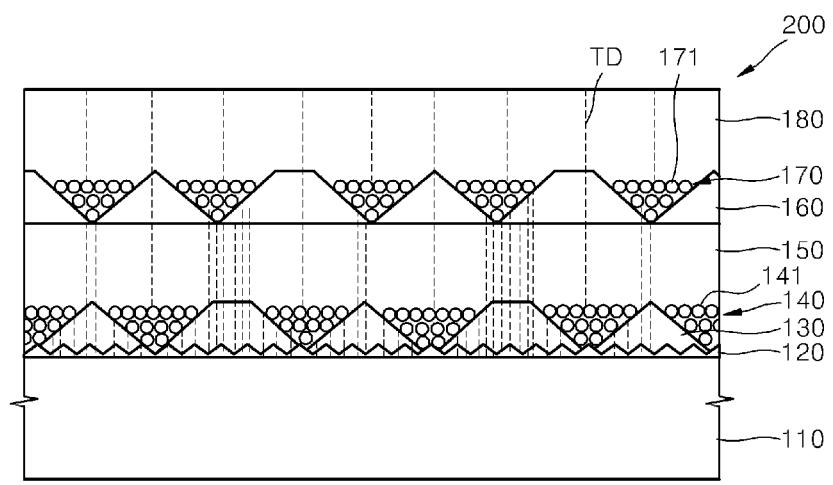

Referring to FIG. 6H, the second non-polar nitride semiconductor layer 180 is formed on the second non-flat non-polar nitride semiconductor layer 160 and the second structure layer 170, to manufacture a semiconductor device 200 having the structure illustrated in FIG. 3.

The structure including second non-flat non-polar nitride semiconductor layer 160, the second structure layer 170, and the second non-polar nitride semiconductor layer 180 may further reduce a TD density as compared to the semiconductor device formed according to the example embodiment shown in FIGS. 6A through 6E because the TD formed on the first non-polar nitride semiconductor layer 150 may be suppressed by the second structure layer 170 and not propagated to the surface of the second non-polar nitride semiconductor layer 180.

According to at least some example embodiments, the nitride semiconductor used in the buffer layer 120, the first and second non-flat non-polar nitride semiconductor layers 130 and 160 and first and second non-polar nitride semiconductor layers 150 and 180 may be formed by adjusting variables of $Al_xIn_yGa_{1-x-y}N$ ($0 \le x$, $y \le 1$, $x \le 1$). Semiconductor devices may be manufactured by using various known III-V-group compound semiconductor growth methods. Semiconductor devices may also be manufactured using various deposition methods such as e-beam evaporators, sublimation sources, Knudsen cell, an ion beam deposition method, vapor epitaxial methods such as atomic layer epitaxy (ALE), chemical vapor deposition (CVD), atmospheric pressure chemical vapor deposition (APCVD), plasma-enhanced chemical vapor deposition (PECVD), rapid thermal chemical vapor deposition (RTCVD), Ultra-High Vacuum Chemical Vapor Deposition (UHVCVD), low pressure chemical vapor deposition (LPCVD), metal-organic chemical vapor deposition (MOCVD), cluster beam chemical vapor deposition (CB-CVD), Gas Source Molecular Beam Epitaxy (GSMBE), and the like. A growth temperature of a relatively low temperature buffer layer may be in the range of surface reaction-controlled temperature in general CVD. A growth temperature of a relatively high temperature epitaxial layer may be in the range of mass transfer-controlled temperature.

Semiconductor devices according to at least some example embodiments may be realized as non-polar nitride semiconductor devices having a structure in which a TD density and/or a BSF density are reduced and/or minimized. Semiconductor devices according to at least some example embodiments may also have a relatively high quantum efficiency. Thus, semiconductor devices may be used as a template for forming a relatively high-quality nitride semiconductor and may be used as electronic devices and/or light-emitting devices having relatively high efficiency and/or relatively high reliability.

In methods of manufacturing semiconductor devices according to at least some example embodiments, a non-flat non-polar nitride semiconductor layer having a 3D surface structure is formed, a structure layer including solid particles is formed on the surface of the non-flat non-polar nitride semiconductor layer, and a relatively high-quality non-polar nitride thin film with a flat surface state and/or a relatively low surface defect density may be formed.

While example embodiments have been particularly shown and described with reference to the drawings, it will be understood by those skilled in the art that various changes in form and details may be made therein without departing from the spirit and scope of this disclosure. The example embodiments should be considered in descriptive sense only and not for purposes of limitation. Therefore, the scope is defined not by the detailed description, but by the appended claims, and all differences within the scope will be construed as being included.

What is claimed is:

1. A semiconductor device comprising:
a first non-flat non-polar nitride semiconductor layer;
a first structure layer on at least a portion of a surface of the first non-flat non-polar nitride semiconductor layer, the first structure layer including a first plurality of solid particles, the first plurality of solid particles being formed of at least one oxide material; and
a first non-polar nitride semiconductor layer on the first non-flat non-polar nitride semiconductor layer and the first structure layer, the first structure layer being between the first non-polar nitride semiconductor layer and at least the portion of the surface of the first non-flat non-polar nitride semiconductor layer.

2. The semiconductor device of claim 1, wherein the first non-flat non-polar nitride semiconductor layer has a three dimensional surface structure, and is formed of a non-polar semiconductor, wherein the surface of the first non-flat non-polar nitride semiconductor layer includes a first plurality of concave portions, and the first plurality of solid particles are disposed in the first plurality of concave portions.

3. A semiconductor device comprising:
a first non-flat non-polar nitride semiconductor layer;
a first structure layer on at least a portion of a surface of the first non-flat non-polar nitride semiconductor layer, the first structure layer including a first plurality of solid particles;
a first non-polar nitride semiconductor layer on the first non-flat non-polar nitride semiconductor layer and the first structure layer;
a second non-flat non-polar nitride semiconductor layer on the first non-polar nitride semiconductor layer;
a second structure layer on at least a portion of a surface of the second non-flat non-polar nitride semiconductor layer, the second structure layer including a second plurality of solid particles; and
a second non-polar nitride semiconductor layer on the second non-flat non-polar nitride semiconductor layer and the second structure layer.

4. The semiconductor device of claim 3, wherein the second non-flat non-polar nitride semiconductor layer has a three dimensional surface structure and is formed of a non-polar compound semiconductor, and wherein the surface of the second non-flat non-polar nitride semiconductor layer includes a second plurality of concave portions, and the second plurality of solid particles are disposed in the second plurality of concave portions.

5. The semiconductor device of claim 4, wherein the first plurality of concave portions and the second plurality of concave portions are offset relative to one another.

6. The semiconductor device of claim 4, wherein the first plurality of solid particles and the second plurality of solid particles have at least one of different sizes and different shapes.

7. The semiconductor device of claim 1, wherein each of the solid particles includes at least one of silica ($SiO_2$), alumina ($Al_2O_3$), titania ($TiO_2$), zirconia ($ZrO_2$), yittria stabilized zirconia ($Y_2O_3$—$ZrO_2$), copper oxide (CuO, $Cu_2O$), and tantalum oxide ($Ta_2O_5$).

8. The semiconductor device of claim 1, wherein each of the first plurality of solid particles has one of a spherical and a polygonal shape.

9. The semiconductor device of claim 8, wherein a refractive index of each of the first plurality of solid particles is different from a refractive index of the first non-polar nitride semiconductor layer.

10. The semiconductor device of claim 1, wherein each of the first plurality of solid particles has one of a spherical shell and a polygonal shell shape.

11. A semiconductor device comprising:
a first non-flat non-polar nitride semiconductor layer;
a first structure layer on at least a portion of a surface of the first non-flat non-polar nitride semiconductor layer, the first structure layer including a first plurality of solid particles; and
a first non-polar nitride semiconductor layer on the first non-flat non-polar nitride semiconductor layer and the first structure layer; wherein
each of the first plurality of solid particles has one of a spherical shell and a polygonal shell shape, and
thicknesses of shells of the first plurality of solid particles is between about 3% and about 50%, inclusive, of a radius of the solid particles.

12. A semiconductor device comprising:
a first non-flat non-polar nitride semiconductor layer;
a first structure layer on at least a portion of a surface of the first non-flat non-polar nitride semiconductor layer, the first structure layer including a first plurality of solid particles; and
a first non-polar nitride semiconductor layer on the first non-flat non-polar nitride semiconductor layer and the first structure layer, the first structure layer being between the first non-polar nitride semiconductor layer and at least the portion of the surface of the first non-flat non-polar nitride semiconductor layer, wherein
each of the first plurality of solid particles has one of a spherical shell and a polygonal shell shape, and
gas is trapped in shells of the first plurality of solid particles.

13. The semiconductor device of claim 1, wherein a refractive index of each of the first plurality of solid particles is the same as or different from a refractive index of the first non-polar nitride semiconductor layer.

14. The semiconductor device of claim 1, further comprising:
a substrate on a lower portion of the first non-flat non-polar nitride semiconductor layer.

15. The semiconductor device of claim 14, wherein the substrate includes one of alumina ($Al_2O_3$), silicon (Si), silicon-carbide (SiC), silicon-germanium (SiGe), germanium (Ge), gallium arsenide (GaAs), indium phosphide (InP), gallium nitride (GaN), indium-arsenide (InAs), gallium phosphide (GaP), and gallium antimonide (GaSb).

16. The semiconductor device of claim 14, further comprising:
a buffer layer formed between the substrate and the first non-flat non-polar nitride semiconductor layer.

\* \* \* \* \*